United States Patent [19]

Larkin

[11] Patent Number: 4,879,525

[45] Date of Patent: Nov. 7, 1989

[54] HIGH GAIN RF AMPLIFIER WITH DIRECTIONAL COUPLER FEEDBACK

[75] Inventor: Stephen J. Larkin, Palm Bay, Fla.

[73] Assignee: Q-Bit Corporation, Palm Bay, Fla.

[21] Appl. No.: 279,771

[22] Filed: Dec. 5, 1988

[51] Int. Cl.[4] .......................... H03F 1/34; H03F 3/191
[52] U.S. Cl. ..................................... 330/294; 330/302; 330/100
[58] Field of Search .................. 330/85, 100, 107, 109, 330/165, 291, 294, 302, 310; 333/112

[56] References Cited

U.S. PATENT DOCUMENTS

| | | | |
|---|---|---|---|
| 3,474,348 | 10/1969 | Cohen | 330/294 |
| 3,648,188 | 3/1972 | Ratcliff | 330/302 X |
| 4,042,887 | 8/1987 | Mead et al. | 333/112 X |

Primary Examiner—Steven Mottola
Attorney, Agent, or Firm—Antonelli, Terry & Wands

[57] ABSTRACT

A high gain RF amplifier comprises first and second common-emitter transistor amplifier stages coupled in cascade between an RF input terminal to which RF signals to be amplified are applied and an RF output terminal from which amplified RF signals are derived. A first RF signal feedback path is coupled between the emitter of the second common-emitter transistor amplifier stage and the RF input terminal. A directional coupler is connected to provide a second, high reverse isolation RF signal feedback path between the output terminal and the emitter of the first common-emitter transistor amplifier stage. The first RF signal feedback path preferably comprises a resistor-capacitor circuit coupled in series between the emitter of the second common-emitter transistor amplifier stage and the base of the first common-emitter transistor amplifier stage. The directional coupler comprises a four port ferrite directional coupler having a first port coupled to the collector of the second common emitter transistor amplifier stage, a second port coupled to the output terminal, a third port coupled to the emitter of the first common emitter transistor amplifier stage and a fourth port coupled to a reference impedance termination.

10 Claims, 1 Drawing Sheet

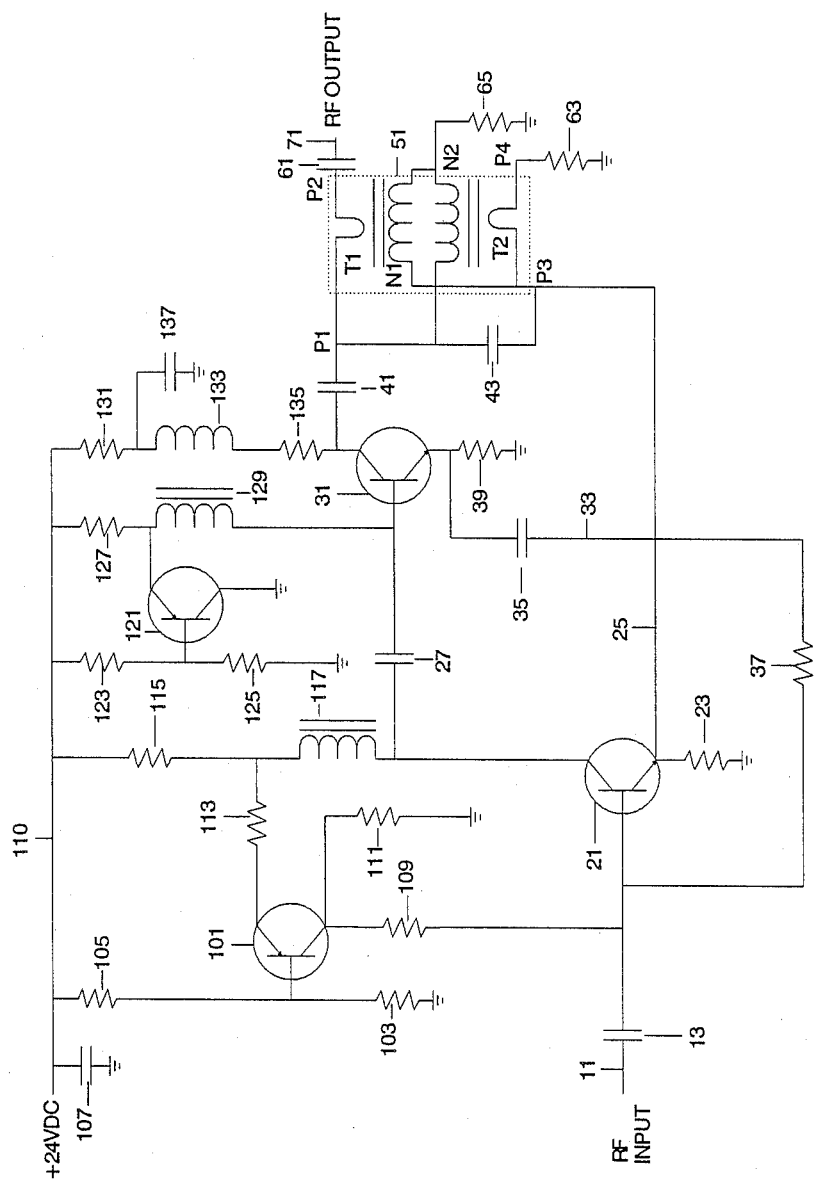

HIGH GAIN RF AMPLIFIER WITH DIRECTIONAL COUPLER FEEDBACK

FIELD OF THE INVENTION

The present invention relates in general to RF amplifier circuits and is particularly directed to a high gain RF amplifier circuit having wide bandwidth, minimum low frequency distortion and high reverse isolation.

BACKGROUND OF THE INVENTION

Multistage amplifier circuits, including those with degenerative feedback, have been employed for a variety of signal processing applications, from audio amplifier circuits to high performance, wideband RF systems. In the former case, the fundamental design criterion usually involves the requisite gain, coupled with the need for minimum loading (high input impedance) and maximum follow-on stage coupling (low output impedance). In high frequency signal environments, such as VHF, UHF and other wideband RF signal applications, additional parameters, such as low-distortion, interface (e.g. 50 ohm) impedance matching, and high reverse isolation constitute critical performance considerations. In a conventional multistage amplifier circuit employing common-emitter transistors, feedback is customarily realized through D.C. coupling networks from the output stage to the input stage, which inherently limits the degree of reverse isolation that is obtainable.

SUMMARY OF THE INVENTION

Pursuant to the present invention, there is provided a high gain signal amplifier, particularly for use in RF applications, that is capable of providing significantly improved performance over conventional D.C.-coupled multistage amplifier configurations, through the use of a (ferrite) directional coupling device to provide high reverse isolation, while effecting degenerative feedback between the amplifier output and the emitter terminal of the common-emitter transistor of the first amplifier stage. In particular, the high gain RF amplifier of the present invention comprises first and second common-emitter transistor amplifier stages coupled in cascade between an RF input terminal to which RF signals to be amplified are applied and an RF output terminal from which amplified RF signals are derived. A first RF signal feedback path, comprised of a series-connected, resistor-capacitor network is coupled between the emitter of the second common-emitter transistor amplifier stage and the RF input terminal. Degenerative RF signal feedback from the amplifier output terminal to the emitter of the first amplifier stage is effected by way of a directional coupler, which provides high reverse isolation between the emitter of the first stage transistor and the output terminal. Preferably, the directional coupler is a four port ferrite directional coupler having a first port coupled to the collector of the second common-emitter transistor amplifier stage, a second port coupled to the output terminal, a third port coupled to the emitter of the first common-emitter transistor amplifier stage and a fourth port coupled to a reference impedance termination.

BRIEF DESCRIPTION OF THE DRAWINGS

The single FIGURE is a schematic diagram of high gain RF amplifier circuit in accordance with a preferred embodiment of the invention.

DETAILED DESCRIPTION

Referring now to the single FIGURE, the high gain RF amplifier circuit in accordance with the present invention is schematically illustrated as comprising a input link 11 to which an RF input signal to be amplified is coupled. Input link 11 is connected to an input coupling capacitor 13 to the base of a first common-emitter bipolar (NPN)transistor 21, the emitter of which is coupled through a resistor 23 to a reference potential terminal (ground) and the collector of which is coupled through an interstage coupling capacitor 27 to the base of a second common-emitter bipolar (NPN) transistor 31. The emitter of transistor 21 is also coupled to a degenerative feedback link 25 from port P3 of a ferrite directional coupler 51, port P1 of which is coupled through an output coupling capacitor 41 to the collector of transistor 31 of the second amplifier stage 31. The emitter of transistor 31 is coupled through resistor 39 to ground, and to a series-connected resistor-capacitor network comprised of resistor 37 and capacitor 35 which provides a second feedback link 33 from the second amplifier (transistor stage 31) to the first amplifier stage (transistor 21). Specifically, feedback link 33 couples the emitter of transistor 31 to the base of transistor 21.

Output signals are derived from the collector of second amplifier stage transistor 31 through the series connection of signal-coupling capacitors 41 and 61, which are coupled in series with transformer T-1 of directional coupler 51. Port P2 of directional coupler 51 is coupled by way of signal coupling capacitor 61 to RF output link 71. Directional coupler 51 further includes port P4 which is coupled to the reference impedance, resistor 63. The common connection of the windings N1 and N2 of transformers T1 and T2 is coupled through resistor 65 to ground. Port P3 is coupled through capacitor 43 to port P1 and winding N2, while the common connection of winding N1 and transformer T2 at port P3 is coupled to feedback link 25.

Operational bias potentials for the common emitter transistor stages 21 and 31 are supplied by way of a bias network 100. Base and collector bias for transistor 21 are provided by way of complementary (with respect to NPN transistor 21) PNP transistor 101, which has its base coupled to a voltage divider network comprised of resistors 103 and 105 which are coupled in series between a (+) high DC voltage link 110 and ground. Also coupled between positive polarity supply link 110 and ground is bypass capacitor 107. The emitter of PNP transistor 101 is D.C.-coupled through resistor 113 t resistor 115, the other side of which is coupled to link 110 and to winding 117, the other end of which is coupled to the collector of transistor 21. The collector of bias transistor 101 is coupled through resistor 109 to the base of transistor 21. A voltage setting resistor 111 is coupled between the collector of transistor 101 and ground, as shown.

Base bias for second amplifier stage transistor 31 is provided by way of PNP transistor 121, the base of which is coupled to a voltage divider network comprising series-connected resistors 123 and 125, coupled between positive polarity supply link 110 and ground.

The collector of transistor 121 is coupled to ground, while its emitter is coupled to resistor 127 and ferrite winding 129 Resistor 127 is further coupled to link 110, while winding 129 is coupled to the base of NPN transistor 31. Collector bias for transistor 31 is supplied by way of a resistor-inductor network comprised of series-connected resistor 131, inductor 133 and resistor 135. A bypass capacitor 137 is coupled between the connection of resistor 131 and inductor 133 and ground.

As mentioned briefly above, cascaded common-emitter amplifier circuits which employ degenerative feedback loops customarily provide D.C. (resistive) coupling between the output and input stages of the circuit. While this is acceptable in low frequency environments (e.g. audio/phonograph) signal amplifiers, the lack of reverse isolation provided by such a network significantly impairs the operational performance of an RF amplifier.

Pursuant to the present invention, coupling between the amplifier output (at the collector of common-emitter transistor 31 and the emitter of input stage transistor 21 is effected by way of directional coupler 51. As referenced previously, and as shown in the FIGURE, directional coupler 51 is a four port ferrite directional coupler, having a pair of ferrite transformers T1 and T2. In the configuration shown, signal power at port P1 is coupled by way of port P3 to feedback link 25, so as to control the emitter degeneration of input stage transistor 21. In the second feedback link between the emitter of transistor 31 and the base of second stage transistor 21, the series connection of resistor 37 and capacitor 35 sets the input impedance of the amplifier without introducing excessive noise. In addition, directional coupler 51 provides the necessary output match between a conventional 50 ohm output cable coupled to link 71 and the collector of transistor 31. Because of the high isolation provided between link 25 and port P2, directional coupler 51 prevents signals at input transistor 21 from affecting the output signal on link 71 through feedback path 25 (i.e. it provides high reverse isolation).

Advantageously, the amplification characteristics of the circuitry shown in the FIGURE are such that it is capable of providing very high open loop gain (both feedback links 25 and 33 open) on the order of 700, while providing a closed loop gain of 22 to 23 dB which is stable. While the circuit shown in the FIGURE has substantially improved characteristics at operational frequencies on the order of 5–70 MHz, the intended performance high gain stable operation is achievable over a bandwidth of several hundred MHz. The high loop gain (open loop gain/closed loop gain) results in low distortion.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A signal amplifier comprising:
   a first amplifier stage having an input to which input signals to be amplified by said amplifier are coupled, and an output;
   a second amplifier stage having an input coupled to the output of said first amplifier stage and an output;
   a directional coupler coupled to the output of said second amplifier stage for deriving an amplified output signal therefrom and being coupled to provide a feedback path between the output of said second amplifier stage and said first amplifier stage; and
   further feedback means for coupling said second amplifier stage to said first amplifier stage.

2. An amplifier according to claim 1, wherein each of said first and second amplifier stages comprises a common emitter transistor.

3. An amplifier according to claim 1, wherein said first amplifier stage comprises a first transistor having a first terminal coupled to receive said input signals, a second terminal coupled to the output of said first amplifier stage, and a third terminal coupled to the feedback path provided from said directional coupler.

4. An amplifier according to claim 3, wherein said second amplifier stage comprises a second transistor having a first terminal coupled to the output of said first amplifier stage, a second terminal coupled to the output of said second amplifier stage, and a third terminal coupled by way of said feedback means to the first terminal of said first transistor.

5. An amplifier according to claim 4, wherein said first transistor comprises a first common emitter bipolar transistor having a base coupled to the input terminal of said first amplifier stage, a collector coupled to the output of said first amplifier stage and an emitter coupled to a reference potential terminal, and wherein said second transistor comprises a second common emitter bipolar transistor having a base coupled to the input terminal of said second amplifier stage, a collector coupled to the output of said second amplifier stage and an emitter coupled to a reference potential terminal and, by way of said feedback means, to the base of said first common emitter bipolar transistor.

6. An amplifier according to claim 5, wherein said directional coupler comprises a four port ferrite directional coupler, a first port of which is coupled to the collector of said second common emitter bipolar transistor, a second port from which the output of said amplifier is derived, a third port of which is coupled to the emitter of said first common emitter bipolar transistor and a fourth port of which is coupled to a reference impedance termination.

7. An amplifier according to claim 5, wherein said feedback means comprises a resistor-capacitor circuit coupled in series between the emitter of said second transistor and the base of said first transistor.

8. A high gain RF amplifier comprising:
   first and second common-emitter transistor amplifier stages coupled in cascade between an RF input terminal to which RF signals to be amplified are applied and an RF output terminal from which amplified RF signals are derived;
   a first RF signal feedback path, coupled between the emitter of the second common-emitter transistor amplifier stage and said RF input terminal; and
   a directional coupler connected to provide a second RF signal feedback path between said output terminal and the emitter of the first common-emitter transistor amplifier stage.

9. A high gain RF amplifier according to claim 8, wherein said first RF signal feedback path comprises a resistor-capacitor circuit coupled in series between the emitter of the second common-emitter transistor amplifier stage and the base of the first common-emitter transistor amplifier stage.

10. A high gain RF amplifier according to claim 9, wherein said directional coupler comprises a four port ferrite directional coupler, a first port of which is coupled to the collector of the second common emitter transistor amplifier stage, a second port of which is coupled to said output terminal, a third port of which is coupled to the emitter of said first common emitter transistor amplifier stage and a fourth port of which is coupled to a reference impedance termination, which provides isolation between said second and third ports of said directional coupler.

* * * * *